United States Patent
Jang et al.

(10) Patent No.: US 9,978,819 B2
(45) Date of Patent: May 22, 2018

(54) ORGANIC LIGHT EMITTING DISPLAY DEVICE

(71) Applicant: LG Display Co., Ltd., Seoul (KR)

(72) Inventors: Jihyang Jang, Gyeonggi-do (KR); Sookang Kim, Gyeonggi-do (KR); Soyoung Jo, Seoul (KR); Wonhoe Koo, Gyeonggi-do (KR); Hyunsoo Lim, Gyeonggi-do (KR); Mingeun Choi, Chungcheongnam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/271,450

(22) Filed: Sep. 21, 2016

(65) Prior Publication Data

US 2017/0084676 A1    Mar. 23, 2017

(30) Foreign Application Priority Data

Sep. 23, 2015    (KR) .................. 10-2015-0134419

(51) Int. Cl.
*H01L 27/32* (2006.01)
*H01L 51/52* (2006.01)

(52) U.S. Cl.
CPC ........ *H01L 27/3246* (2013.01); *H01L 27/322* (2013.01); *H01L 27/326* (2013.01); *H01L 27/3258* (2013.01); *H01L 27/3272* (2013.01); *H01L 51/5209* (2013.01); *H01L 51/5225* (2013.01); *H01L 51/5275* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 9,142,793 B2 * | 9/2015 | Choi | ............... H01L 51/5271 |
| 2004/0017152 A1 | 1/2004 | Hashimoto et al. | |
| 2014/0354711 A1 | 12/2014 | In et al. | |
| 2015/0145423 A1 | 5/2015 | Lee et al. | |
| 2015/0155520 A1 | 6/2015 | Kim et al. | |

FOREIGN PATENT DOCUMENTS

| | | |
|---|---|---|
| JP | 2004-127575 | 4/2004 |
| JP | 2015-109136 | 6/2015 |
| KR | 1020040010342 A | 1/2004 |
| KR | 20110122250 A * | 11/2011 |

(Continued)

OTHER PUBLICATIONS

Machine Translation of KR 20110122250 A.*

(Continued)

*Primary Examiner* — Joseph Schoenholtz

(74) *Attorney, Agent, or Firm* — Morgan, Lewis & Bockius LLP

(57) ABSTRACT

An organic light emitting display device includes an overcoating layer on a substrate; a first electrode on the overcoating layer; a bank layer on the overcoating layer and the first electrode, the bank layer including an opening through which the first electrode is exposed; a pattern layer having an island shape on the exposed portion of the first electrode; an organic emission layer on the first electrode and the pattern layer; and a second electrode on the organic emission layer.

20 Claims, 13 Drawing Sheets

(56) References Cited

FOREIGN PATENT DOCUMENTS

| KR | 1020110122250 A | 11/2011 |
|----|-----------------|---------|
| TW | 201445535 A | 12/2014 |
| TW | 201521004 A | 6/2015 |
| TW | 201523962 A | 6/2015 |

OTHER PUBLICATIONS

Office Action dated Oct. 30, 2017 from the Taiwan Patent Office in related Taiwanese application No. 105130497 (partial English translation).

\* cited by examiner

ORGANIC LIGHT EMITTING DISPLAY DEVICE

CROSS-REFERENCE TO RELATED APPLICATIONS

This application claims priority from Korean Patent Application No. 10-2015-0134419, filed on Sep. 23, 2015, which is hereby incorporated by reference for all purposes as if fully set forth herein.

BACKGROUND

Field of the Invention

The present invention relates to an organic light emitting display device that displays an image.

Description of the Related Art

An organic light emitting display device, which has recently attracted a lot of attention as a display device, uses a self-emitting organic light emitting diode (OLED). Thus, the organic light emitting display device has advantages of a high response speed, increased contrast ratio, increased luminous efficiency, high brightness, and wide view angle.

Light emitted from an organic emission layer of the organic light emitting display device is output to the outside of the organic light emitting display device through various elements in the organic light emitting display device. However, a portion of the light emitted from the organic emission layer may not be output to the outside of the organic light emitting display device but may be confined in the organic light emitting display device, thereby causing problems with the light extraction efficiency of the organic light emitting display device. To improve the light extraction efficiency of the organic light emitting display device, a method of attaching a micro lens array (MLA) to an outer surface of a substrate of the organic light emitting display device has been used.

SUMMARY

Accordingly, the present invention is directed to an organic light emitting display device that substantially obviates one or more of the problems due to limitations and disadvantages of the related art.

An object of the present invention is to provide an organic light emitting display device that can improve external luminous efficiency and reduce power consumption.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display device comprises an overcoating layer on a substrate; a first electrode on the overcoating layer; a bank layer on the overcoating layer and the first electrode, the bank layer including an opening through which the first electrode is exposed; a pattern layer having an island shape on the exposed portion of the first electrode; an organic emission layer on the first electrode and the pattern layer; and a second electrode on the organic emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
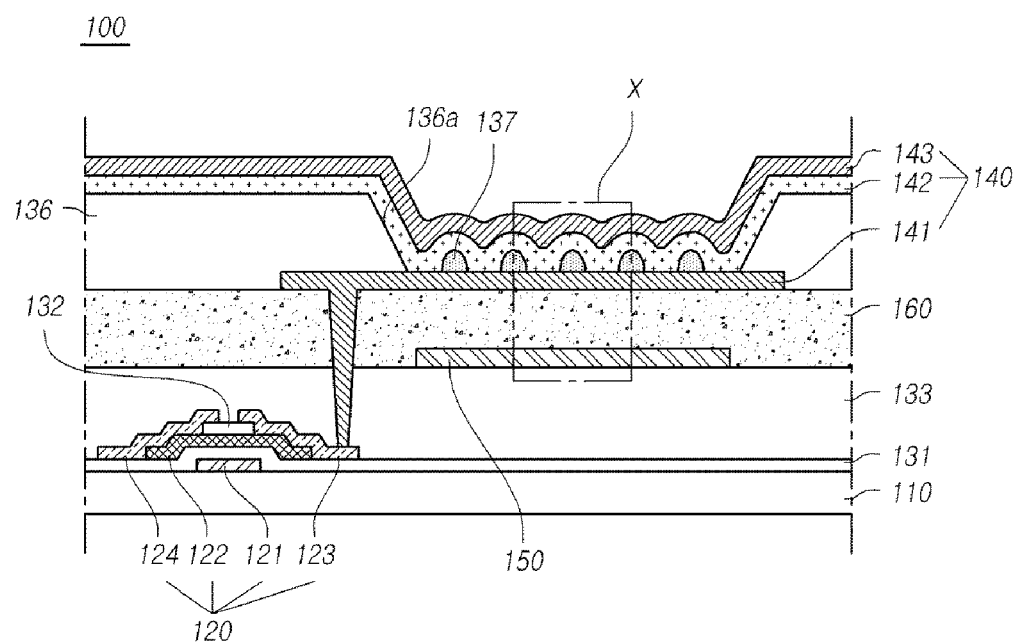
FIG. 1 is a cross-sectional view of an organic light emitting display device according to an example embodiment.

Hereinafter, embodiments of the present invention will be described in detail with reference to the accompanying drawings. When reference numerals refer to components of each drawing, although the same components are illustrated in different drawings, the same components are referred to by the same reference numerals as possible. Further, if it is considered that description of related known configuration or function may cloud the gist of the present invention, the description thereof will be omitted.

Further, in describing components of the present invention, terms such as first, second, A, B, (a), and (b) can be used. These terms are used only to differentiate the components from other components. Therefore, the nature, order, sequence, or number of the corresponding components is not limited by these terms. It is to be understood that when one element is referred to as being "connected to" or "coupled to" another element, it may be directly connected to or directly coupled to another element, connected to or coupled to another element, having still another element "intervening" therebetween, or "connected to" or "coupled to" another element via still another element.

Figure 2:
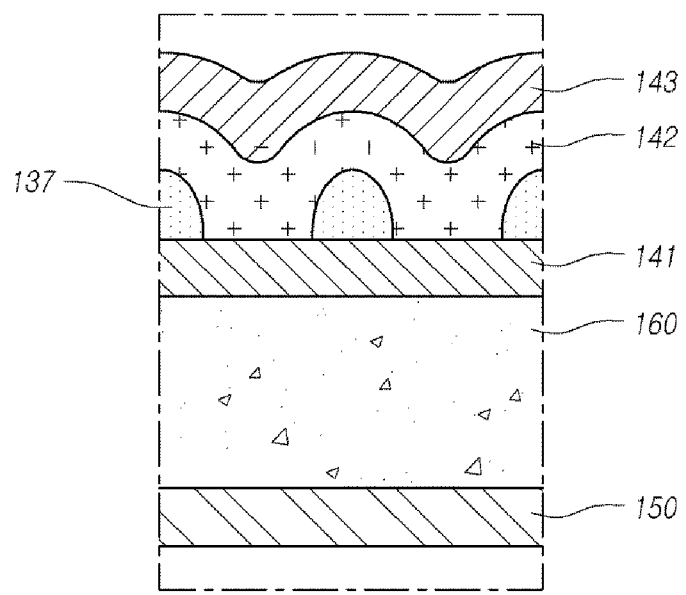
FIG. 2 is an enlarged cross-sectional view of an area X of FIG. 1.

FIG. 1 is a cross-sectional view of an organic light emitting display device according to an example embodiment. FIG. 2 is an enlarged cross-sectional view of an area X of FIG. 1.

As shown in FIG. 1 and FIG. 2, an organic light emitting display device 100 may include a substrate 110, a thin-film transistor 120, a color filter 150, an overcoating layer 160, a pattern layer 137, and an organic light emitting diode 140.

The thin-film transistor 120, which includes a gate electrode 121, an active layer 122, a source electrode 123, and a drain electrode 124, is on the substrate 110. Specifically, the gate electrode 121 is on the substrate 110, and a gate insulation layer 131 configured to insulate the gate electrode 121 and the active layer 122 is on the gate electrode 121 and the substrate 110. Further, the active layer 122 is disposed on the gate insulation layer 131, and an etch stopper 132 is on the active layer 122. Furthermore, the source electrode 123 and the drain electrode 124 are on the active layer 122 and the etch stopper 132. The source electrode 123 and the drain electrode 124 are electrically connected to the active layer 122 to be in contact with the active layer 122 and on a portion of the etch stopper 132. The etch stopper 132 may be omitted.

In FIGS. 1 and 2, from among various thin-film transistors that can be included in the organic light emitting display device 100, only a driving thin-film transistor has been illustrated for convenience in explanation. Further, in the thin-film transistor 120 may have an inverted staggered structure or a bottom-gate structure in which the gate electrode 121 is located across from the source electrode 123 and the drain electrode 124 with the active layer 122 interposed therebetween. However, a thin-film transistor may be used having a coplanar structure or a top-gate structure in which the gate electrode 121 is located on the same side of the active layer 122 as the source electrode 123 and the drain electrode 124.

In FIGS. 1 and 2, a passivation layer 133 is on the thin-film transistor 120, and the color filter 150 is on the passivation layer 133. The color filter 150 is configured to convert the color of a light emitted from an organic emission layer 142, and may be one of a red color filter, a green color filter, and a blue color filter.

The overcoating layer 160 is on the color filter 150 and the passivation layer 133. The overcoating layer 160 includes a flat top surface. The organic light emitting diode 140 (which includes a first electrode 141, the organic emission layer 142, and a second electrode 143), a bank layer 136, and a pattern layer 137 are on the overcoating layer 160.

The bank layer 136 is on the overcoating layer 160 and the first electrode 141, and includes an opening 136a through which the first electrode 141 is exposed. The bank layer 136 is configured to distinguish adjacent pixel (or subpixel) areas, and may be between the adjacent pixel (or subpixel) areas.

The pattern layer 137 is on the first electrode 150. The pattern layer 137 has an island shape on the first electrode 150 exposed through the opening 136a of the bank layer 136.

The pattern layer 137 may include the same material as the bank layer 136. In terms of processes, after the flat overcoating layer 160 is formed, the first electrode 141 is formed on the overcoating layer 160. An original material of the bank layer 136 and the pattern layer 137 is coated on the overcoating layer 160 and the entire surface of the first electrode 141. Then, an exposure and development process is performed using a mask corresponding to the opening 136a of the bank layer 136 and the pattern layer 137. Herein, a location corresponding to the pattern layer 137 is exposed and developed with a smaller amount of light than a related art process. Thus, the bank layer 136 and the pattern layer 137 can be formed of the same material as the bank layer 136 at the same time without a specially added process or mask.

The organic emission layer 142 is disposed on the first electrode 141 and the pattern layer 137, and the second electrode 143 configured to supply one of an electron or a hole to the organic emission layer 142 is on the organic emission layer 142.

In the opening 136a of the bank layer 136, the first electrode 141 on the overcoating layer 160 has a shape according to the surface topology of the overcoating layer 160. That is, in the opening 136a of the bank layer 136, the first electrode 141 on the overcoating layer 160 has a flat shape including flat bottom and top surfaces. The organic emission layer 142 and the second electrode 143 are disposed along a shape of the top surface of the first electrode 141 according to the surface morphology of the overcoating layer 160 and a shape of a top surface of the pattern layer 137. Thus, the organic emission layer 142 and the second electrode 143 have non-flat top and bottom surfaces. Therefore, the first electrode 141 has a flat shape, whereas the organic emission layer 142 and the second electrode 143 have a convex shape on the pattern layer 137. As a result, in the organic light emitting display device 100, the pattern layer 137 is on the first electrode 141 and the organic emission layer 142 and the second electrode 143 have bends. Thus, the organic light emitting display device 100 includes a micro lens array (MLA) structure.

In the organic light emitting display device 100, a concave portion or a convex portion is not formed on the overcoating layer 160 and the bank layer 136, and the pattern layer 137 are formed at the same time. Thus, it is possible to form a micro lens array structure without an additional process. Because the micro lens array structure is formed using the pattern layer 137, the external light extraction efficiency can be improved.

Figure 3:
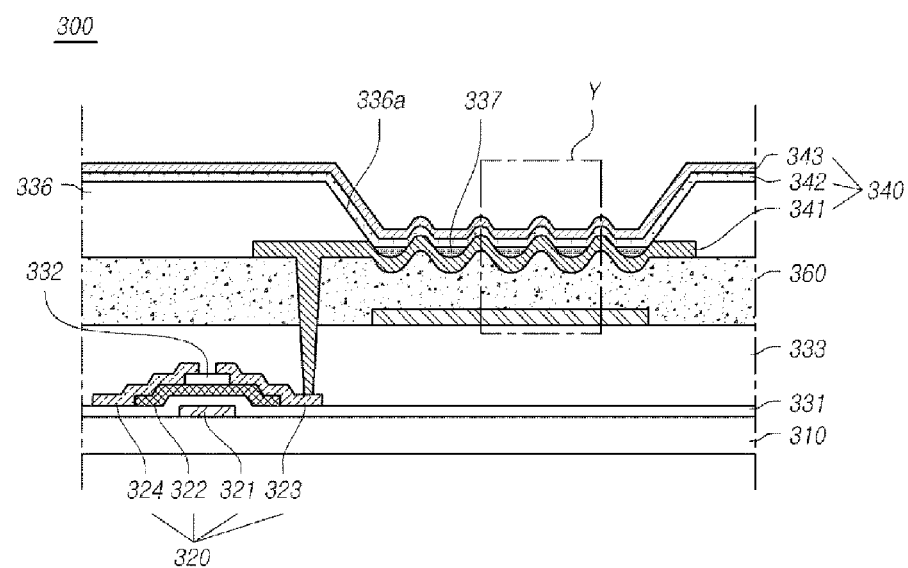
FIG. 3 is a cross-sectional view of an organic light emitting display device according to another example embodiment.
Figure 4A:
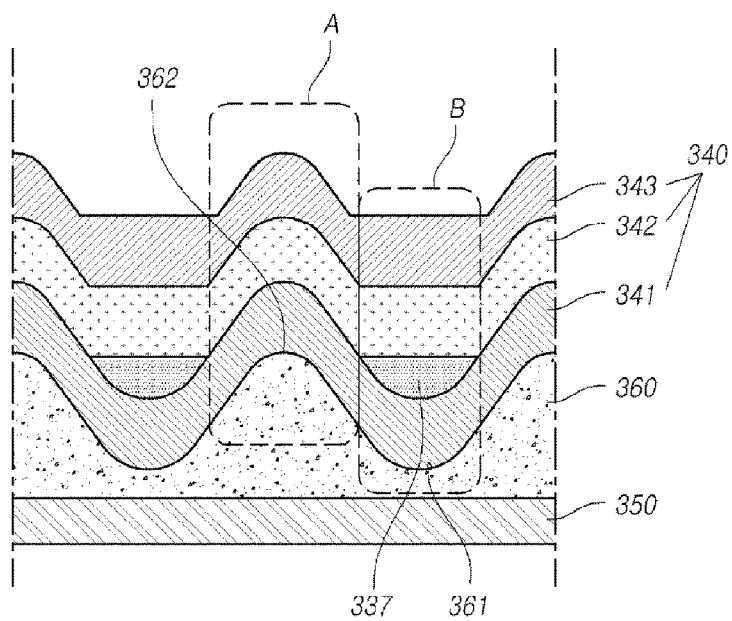
FIG. 4A is an enlarged cross-sectional view of an area Y of FIG. 3.
Figure 4B:
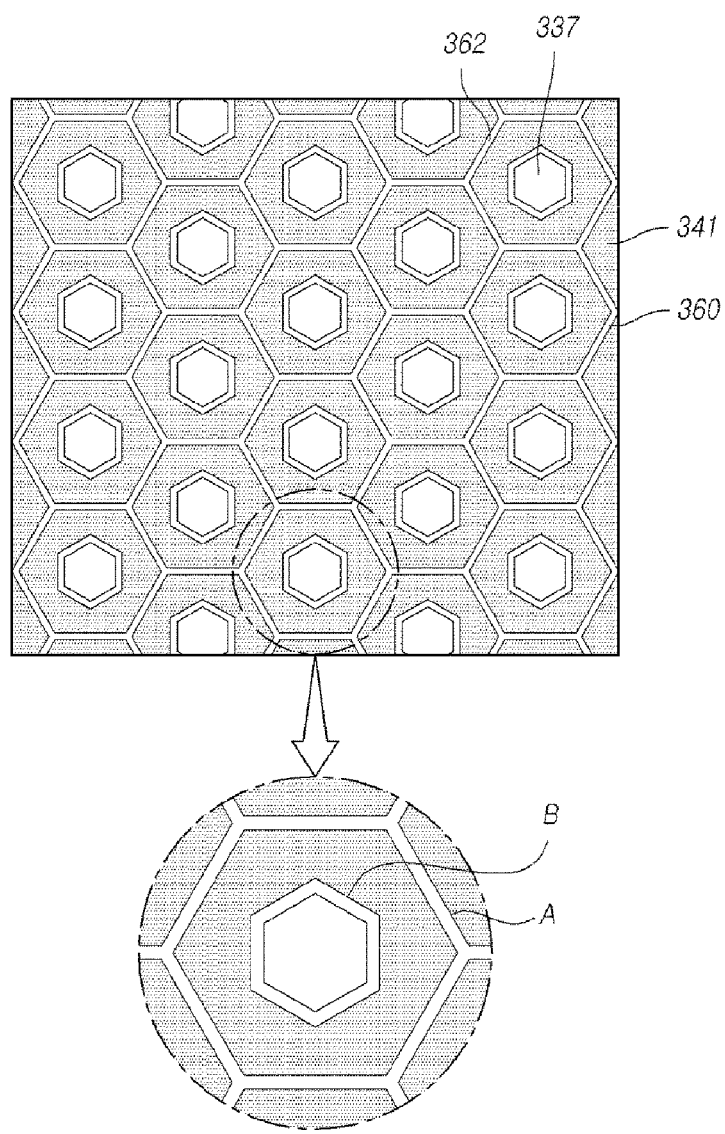
FIG. 4B is a partial plane view of an overcoating layer, a first electrode, and a pattern layer in the area Y of FIG. 3.

FIG. 3 is a cross-sectional view of an organic light emitting display device according to another example embodiment. FIG. 4A is an enlarged cross-sectional view of an area Y of FIG. 3. FIG. 4B is a partial plane view of an overcoating layer, a first electrode, and a pattern layer in the area Y of FIG. 3.

With reference to FIG. 3 and FIG. 4A, an organic light emitting display device 300 includes a substrate 310, a thin-film transistor 320, a color filter 350, an overcoating layer 360, a pattern layer 337, and an organic light emitting diode 340.

The organic light emitting display device 300 illustrated in FIG. 3 and FIG. 4A are a bottom-emission organic light emitting display device. However, the organic light emitting display device 300 may be a top-emission organic light emitting display device in which the color filter 350 is located across from the substrate 310.

The thin-film transistor 320 including a gate electrode 321, an active layer 322, a source electrode 323, and a drain electrode 324 is disposed on the substrate 310. Specifically, the gate electrode 321 is on the substrate 310, and a gate insulation layer 331 configured to insulate the gate electrode 321 and the active layer 322 is disposed on the gate electrode 321 and the substrate 310. Further, the active layer 322 is on the gate insulation layer 331, and an etch stopper 332 is disposed on the active layer 322. Furthermore, the source electrode 323 and the drain electrode 324 are on the active layer 322 and the etch stopper 332. The source electrode 323 and the drain electrode 324 are electrically connected to the active layer 322 to be in contact with the active layer 322 and on a portion of the etch stopper 332. The etch stopper 332 may be omitted.

A passivation layer 333 is disposed on the thin-film transistor 320, and the color filter 350 is disposed on the passivation layer 333.

FIG. 4A illustrates that the passivation layer 333 flattens an upper part of the thin-film transistor 320. However, the passivation layer 333 may not flatten the upper part of the thin-film transistor 320, but may be disposed according to the surface morphology of elements located under the passivation layer 333.

The color filter 350 is configured to convert a color of the light emitted from an organic emission layer 342, and may be one of a red color filter, a green color filter, and a blue color filter. The color filter 350 is at a location corresponding to an emission area on the passivation layer 333. Herein, the emission area refers to an area where a light is emitted from the organic emission layer 342 by the first electrode 341 and the second electrode 343. The color filter 350 is at a location corresponding to the emission area, which means that the color filter 350 is disposed to suppress occurrence of blurring phenomenon or ghost phenomenon caused by mixing of lights emitted from adjacent emission areas.

For example, the color filter 350 may overlap the emission area. Herein, a location and a size of the color filter 350 may be determined by various factors including a size and a location of the emission area, a distance between the color filter 350 and the first electrode 341, a distance between the color filter 350 and a concave portion 361 (or a convex portion) of the overcoating layer 360, and a distance between emission areas.

The overcoating layer 360 is disposed on the color filter 350 and the passivation layer 333. FIG. 4A illustrates that the passivation layer 333 (see FIG. 3) is included in the organic light emitting display device 300. However, the passivation layer 333 may be omitted, and the overcoating layer 360 may be directly on the thin-film transistor 320. Further, FIG. 4A illustrates that the color filter 350 is on the passivation layer 333 (see FIG. 3), but the present invention is not limited thereto. The color filter 350 may be provided at any location between the overcoating layer 360 and the substrate 310.

The overcoating layer 360 includes a plurality of concave portions 361 to overlap the color filter 350 and a first connection portion 362 that connects the concave portions 361 adjacent to each other. FIG. 4A is a cross-sectional view of the plurality of concave portions 361 having a hexagonal shape. The first connection portion 362 is a higher portion between the concave portions 361 adjacent to each other. The overcoating layer 360 functions as a flattening layer in an area where the plurality of concave portions 361 is disposed.

As illustrated in FIG. 4B, each of the plurality of concave portions 361 (see FIG. 4A) and the first connection portion 362 may have an overall hexagonal shape in a plane view, but is not limited thereto and may have various shapes such as an overall hemispherical shape, semi-elliptical shape or square shape. The plurality of concave portions 361 may be disposed in a hexagonal honeycomb structure in a plane view. In other words, a hexagonal concave portion 361 shares one side with another adjacent concave portion 361 to be formed as one body having a hexagonal honeycomb structure.

The organic light emitting diode 340 including a first electrode 341, the organic emission layer 342, and a second electrode 343, a bank layer 336, and a pattern layer 337 are disposed on the overcoating layer 360. Herein, although not illustrated, a second insulating passivation layer (not illustrated) configured to suppress the spread of outgassing from the overcoating layer 360 to the organic light emitting diode 340 to reduce the lifetime of the organic light emitting diode, and having a shape according to the morphology of the concave portions 361 of the overcoating layer 360 and a refractive index similar to that of the first electrode 341 may be further disposed between the overcoating layer 360 and the first electrode 341.

Specifically, the first electrode 341 configured to supply one of an electron or a hole to the organic emission layer 342 is disposed on a portion of the overcoating layer 360. The first electrode 341 may be a positive electrode, a pixel electrode, or an anode in a normal OLED, or may be a negative electrode, a pixel electrode, or a cathode in an inverted OLED.

The first electrode 341 may be connected to the source electrode 323 of the thin-film transistor 320 through a contact hole formed in the overcoating layer 360. Here, the first electrode 341 is described as being connected to the source electrode 323 on the assumption that the thin-film transistor 320 is an N-type thin-film transistor. However, if the thin-film transistor 320 is a P-type thin-film transistor, the first electrode 341 may be connected to the drain electrode 324. The first electrode 341 may be electrically connected to the organic emission layer 342 directly contacting the organic emission layer 342 or contacting the organic emission layer 342 with a conductive material interposed therebetween.

The first electrode 341 is disposed in a shape according to the surface morphology of the overcoating layer 360. Therefore, the first electrode 341 having a concave morphology on the concave portion 361 of the overcoating layer 360.

The bank layer 336 is on the overcoating layer 360 and the first electrode 341 and includes an opening 336a through which the first electrode 341 is exposed. The bank layer 336 is configured to distinguish adjacent pixel (or subpixel) areas, and may be disposed between the adjacent pixel (or subpixel) areas. The concave portions 361 and the first connection portion 362 of the overcoating layer 360 are disposed to overlap the opening 336a of the bank layer 336. As described above, the concave portions 361 and the first connection portion 362 of the overcoating layer 360 overlapping the color filter 350. Thus, the concave portions 361 and the first connection portion 362 of the overcoating layer 360 overlap the color filter 350 thereunder and also overlap the opening 336a of the bank layer 336 thereon. The pattern layer 337 is on the first electrode 341. The pattern layer 337 has an island shape on the first electrode 341 exposed through the opening 336a of the bank layer 336. That is, the pattern layer 337 on the first electrode 341 partially fills recessed areas of the plurality of concave portions 361 of the overcoating layer 360. The pattern layer 337 may be located in all of the plurality concave portions as illustrated in FIG. 4B, but is not limited thereto. The pattern layer 337 may be located in some of the plurality of concave portions. The pattern layer 337 may lessen bends of a surface on which the organic light emitting diode 340 is disposed.

The pattern layer 337 may include the same material as the bank layer 336. In terms of processes, after the overcoating layer 360 including the concave portions 361 and the first connection portion 362 is formed, the first electrode 341 is formed on the overcoating layer 360. An original material of the bank layer 336 and the pattern layer 337 is coated on the overcoating layer 360 and the entire surface of the first electrode 341. Then, an exposure and development process is performed using a mask corresponding to the opening 336a of the bank layer 336 and the pattern layer 337. Herein, a location corresponding to the pattern layer 337 is exposed and developed with a smaller amount of light than a conventional process. Thus, the bank layer 336 and the pattern layer 337 can be formed of the same material as the bank layer 336 at the same time without a specially added process or mask.

The organic emission layer 342 is disposed on the first electrode 341 and the pattern layer 337, and the second electrode 343 configured to supply one of an electron or a hole to the organic emission layer 342 is disposed on the organic emission layer 342. The organic emission layer 342 is disposed in a structure (e.g., tandem white) in which a plurality of organic emission layers is laminated to emit a white light. The organic emission layer 342 includes a first organic emission layer configured to emit a blue light and a second organic emission layer disposed on the first organic emission layer and configured to emit a light of a color which turns to white when mixed with blue. The second organic emission layer may be, for example, an organic emission layer that emits a yellow-green light. Meanwhile, the organic emission layer 342 may include only an organic emission layer that emits one of a blue light, a red light, and a green light. In this case, the color filter 350 may not be provided. The second electrode 343 may be a negative electrode, a common electrode, or a cathode in a normal OLED, or may be a positive electrode, a common electrode, or an anode in an inverted OLED.

The organic emission layer 342 and the second electrode 343 are disposed along a shape of the top surface of the first electrode 341 according to the surface morphology of the overcoating layer 360 and a shape of a top surface of the pattern layer 337 disposed on the first electrode 341 and partially filing the recessed areas of the plurality of concave portions 361 of the overcoating layer 360, thereby having non-flat top and bottom surfaces. For example, if the organic emission layer 342 and the second electrode 343 are disposed by deposition, the organic emission layer 342 and the second electrode 343 are disposed according to the morphology of the top surfaces of the first electrode 341 and the pattern layer 337.

With reference to FIG. 4A, a thickness of the organic emission layer 342 between the concave portion 361 and the first connection portion 362 of the overcoating layer 360 may be less than a thickness of the organic emission layer 342 at the bottom of the concave portion 361 or the top of the first connection portion 362 of the overcoating layer 360. Particularly, the organic emission layer 342 may have the least thickness at a location where the organic emission layer 342 has the highest slope between the concave portion 361 and the first connection portion 362 of the overcoating layer 360.

For example, if the organic emission layer 342 is formed by deposition, the organic emission layer 342 deposited in a direction perpendicular to the substrate 310 has the same thickness. However, the organic emission layer 342 has a shape according to the morphology of the overcoating layer 360. Thus, actually, the organic emission layer 342 has the least thickness for current drive between the first electrode 341 and the second electrode 342 at a location where the organic emission layer 342 has the highest slope, and has the greatest thickness at a location where the organic emission layer 342 has the lowest slope, i.e., at the bottom or the top.

In terms of an emission amount of the organic emission layer 342 depending on a thickness of the organic emission layer 342, an emission amount per unit area of the organic emission layer 342 between the concave portion 361 and the first connection portion 362 of the overcoating layer 360 may be greater than an emission amount per unit area of the organic emission layer 342 at the bottom of the concave portion 361 or the top of the first connection portion 362. Particularly, the organic emission layer 342 may have the greatest emission amount at a location where the organic emission layer 342 has the highest slope between the concave portion 361 and the first connection portion 362 of the overcoating layer 360.

Figure 5:
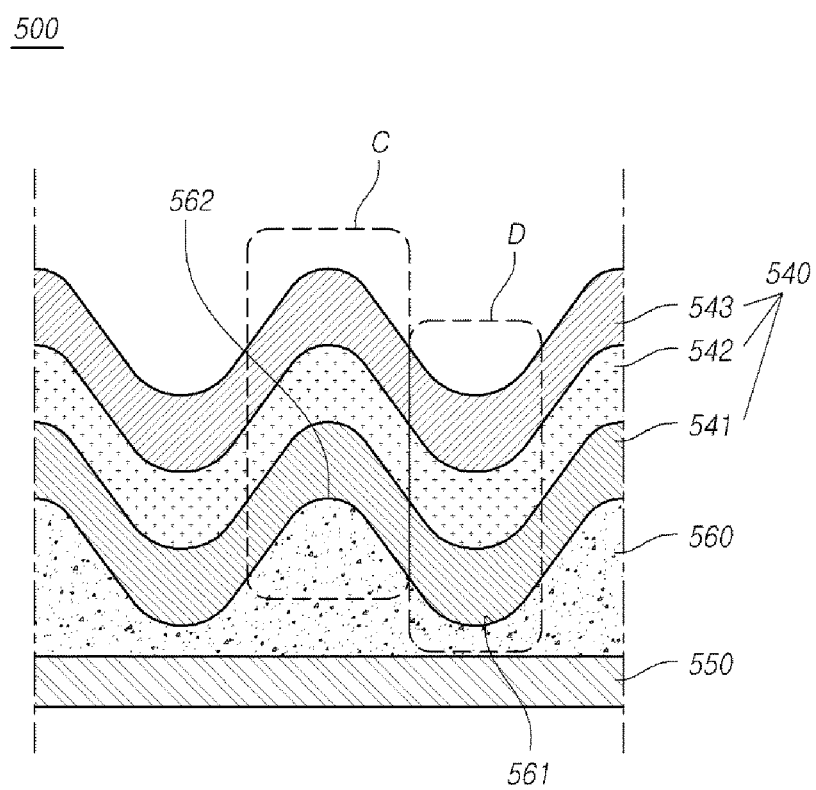
FIG. 5 is a partial cross-sectional view of an organic light emitting display device according to a comparative example.

FIG. 5 is a partial cross-sectional view of an organic light emitting display device according to a comparative example.

As shown in FIG. 5, an organic light emitting display device 500 according to the comparative example may include a color filter 550 and an overcoating layer 560 having concave portions 561 and a first connection portion 562. Further, the organic light emitting display device 500 includes an organic light emitting diode 540 including a first electrode 541, an organic emission layer 542, and a second electrode 543 disposed in sequence on the overcoating layer 560. The organic light emitting display device 500 according to the comparative example does not include the pattern layer 337 included in the organic light emitting display device 300 according to another example embodiment, and the first electrode 541, the organic emission layer 542, and the second electrode 543 have a shape according to the surface topology of the overcoating layer 560.

If the organic light emitting diode 540 has a micro lens array structure for improving external light extraction efficiency, concave bends are formed on a surface of the organic light emitting diode 540 by the concave portions 561 of the overcoating layer 560 due to characteristics of the pattern as illustrated in FIG. 5. As the slope is increased, a thickness of the organic emission layer 542 between the first electrode 541 and the second electrode 543 is decreased so that an effective emission area C where an electric field is locally concentrated, i.e., an area between the concave portion 561 and the first connection portion 562 of the overcoating layer 560, is generated. When the organic light emitting diode 540 is driven, an electric field is locally concentrated and a main current path is formed in the effective emission area, so that emission mainly occurs in the effective emission area. However, the concave portion 561 of the overcoating layer 560 is a non-effective emission area D, and light is hardly extracted from the non-effective emission area D. Although the non-effective emission area D consumes power, light is hardly extracted from the non-effective emission area D. Thus, the external light extraction efficiency is decreased.

Further, the bends of the concave portions 561 of the overcoating layer 560 mainly reflect an external light, thereby increasing reflectivity.

As illustrated in FIG. 4A and FIG. 4B, an area A where the pattern layer 337 is not disposed on the first electrode 341 exposed through the opening 336a of the bank layer 336 corresponds to an effective emission area which emits a light because the pattern layer 337 is not disposed between the first electrode 341 and the organic emission layer 342 and the second electrode 343. An area B where the pattern layer 337 is disposed on the first electrode 341 exposed through the opening 336a of the bank layer 336 corresponds to a non-effective emission area, which does not emit a light because the pattern layer 337 is disposed between the first electrode 341 and the organic emission layer 342 and the second electrode 343.

In the organic light emitting display device 300 according to another example embodiment, the organic emission layer 342 has a non-uniform thickness due to the bends of the surface of the organic light emitting diode 340 caused by the bends of the concave portions 361 of the overcoating layer 360 and a current applied is concentrated in an area having a high slope so that a light is emitted from the effective emission area A only. However, in the non-effective emission area B, the pattern layer 337 is disposed between the first electrode 341 and the organic emission layer 342 and the second electrode 343, so that a light cannot be emitted. Therefore, it is possible to minimize or suppress most of the light from being confined in the organic light emitting diode 340 without a contribution to improvement of light extraction efficiency in a non-effective emission area D as illustrated in FIG. 5. Further, it is possible to minimize or suppress the light confined in the organic light emitting diode 340 from remaining as light leakage components in the non-effective emission area D as illustrated in FIG. 5. Accordingly, the external light extraction efficiency of the organic light emitting diode 340 can be maximized.

In the organic light emitting display device 300 according to another example embodiment, the pattern layer 337 disposed on the concave portion 561 of the overcoating layer 560 lessens bends of the overcoating layer 560. Thus, an external light reflectivity can be decreased.

Table 1 lists a measurement result of a driving voltage V, a current density J, a luminous efficiency cd/A, and an external quantum efficiency EQE of the organic light emitting display device 300 according to another example embodiment illustrated in FIG. 3 through FIG. 4B and the organic light emitting display device 500 according to the comparative example illustrated in FIG. 5. In Table 1, the external quantum efficiency EQE can be defined by multiplying internal quantum efficiency IQE and a light extraction efficiency together.

TABLE 1

| | Volt (V) | J (mA/cm2) | cd/A | Improvement rate (%) | EQE | Improvement rate (%) |
|---|---|---|---|---|---|---|
| Organic light emitting display device 500 according to Comparative Example | 7.43 | 10 | 85.41 | 36.1 | 33.07 | 41.6 |
| Organic light emitting display device 300 according to example embodiment | 7.55 | 10 | 100.41 | 45.6 | 39.08 | 50.6 |

As can be seen from Table 1, the organic light emitting display device 300 according to another example embodiment illustrated in FIG. 3 through FIG. 4B is improved in luminous efficiency and external quantum efficiency by 10% or more, for example, about 15%, as compared with the organic light emitting display device 500 according to the comparative example illustrated in FIG. 5.

Meanwhile, in the organic light emitting display device 300 according to another example embodiment described with reference to FIG. 3 through FIG. 4B, the color filter 350 disposed under the overcoating layer 360 to overlap the opening 336a of the bank layer 336 is not in contact with the first electrode 341.

Figure 6:
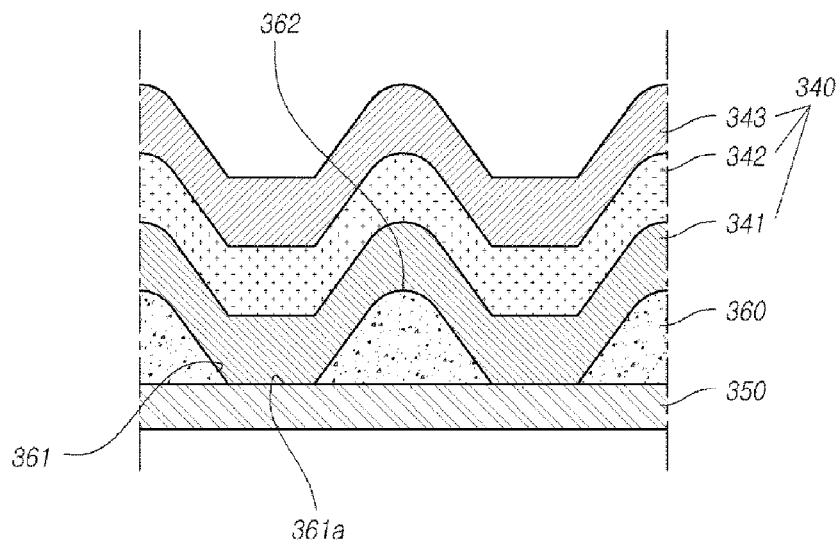
FIG. 6 is a cross-sectional view illustrating an example of an overcoating layer in a general organic light emitting display device.

If the plurality of concave portions 361 is formed in the overcoating layer 360 using a negative photoresist material through photolithography or the like, as illustrated in FIG. 6, the easiest way to form the concave portions 361 of the overcoating layer 360 with good uniformity of the entire substrate is to expose bottoms 361a of the concave portions 361. Herein, if the bottoms 361a of the concave portions 361 are exposed, the color filter 350 is also exposed. Thus, there may be a big problem with the reliability of the organic light emitting diode 340. For this reason, even if the concave portions 361 of the overcoating layer 360 are satisfactory in shape, the concave portions 361 of the overcoating layer 360 may not be applied to the organic light emitting display device 300.

Figure 7:
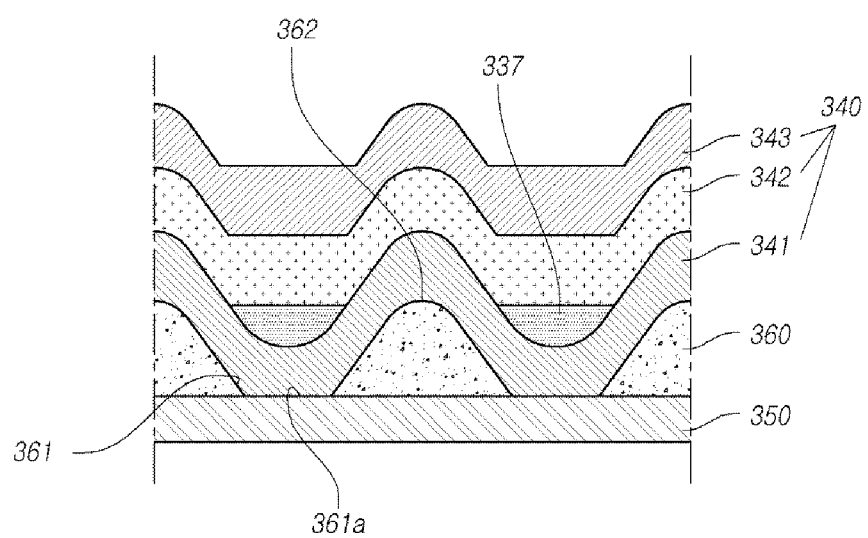
FIG. 7 is a cross-sectional view illustrating a modification example of an overcoating layer in the organic light emitting display device according to another example embodiment.

As illustrated in FIG. 7, in the organic light emitting display device 300 according to another example embodiment, the bottoms 361a of the plurality of concave portions 361 of the overcoating layer 360 are opened and the first electrode 341 may be in contact with the color filter 350 through the opened concave portions 361.

Therefore, if the plurality of concave portions 361 is formed in the overcoating layer 360 using a negative photoresist material through photolithography or the like, the concave portions 361 of the overcoating layer 360 are formed with high uniformity over the entire substrate, and the pattern layer 337 is on the concave portions 361 of the overcoating layer 360 so that a non-effective emission area is formed. Thus, the reliability of the organic light emitting diode 340 can be maintained.

Figure 8A:
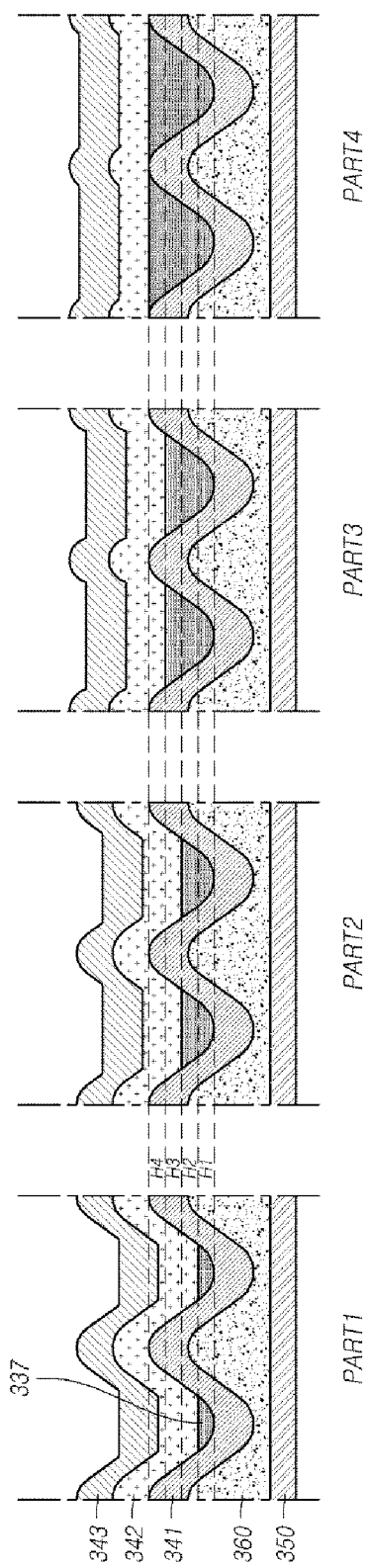
FIG. 8A through FIG. 8C are diagrams comparatively illustrating an external light extraction efficiency and a distribution (view angle) depending on a location of an emission surface of an organic emission layer (adjustment of an effective emission area) with an adjusted thickness of a pattern layer disposed on a concave portion of an overcoating layer.
Figure 8B:
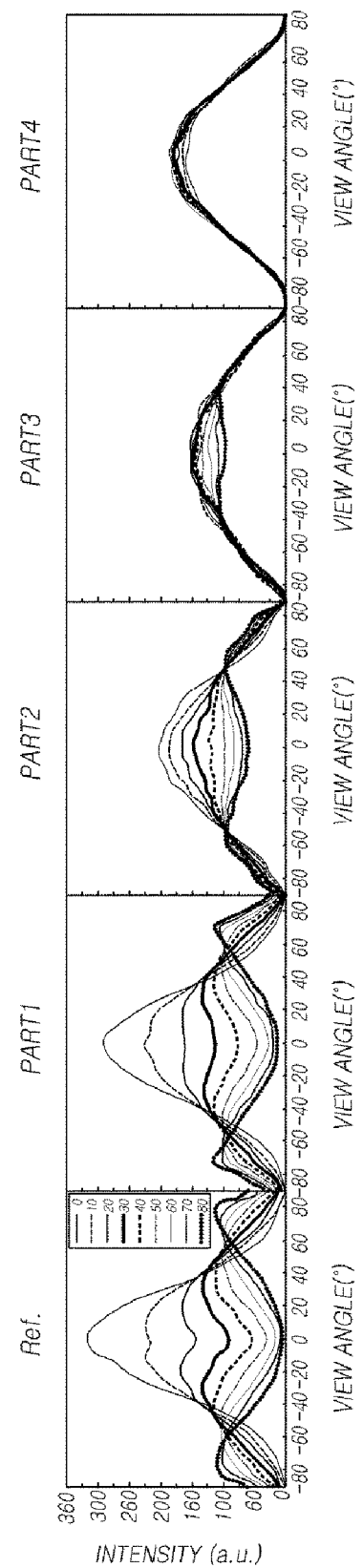
Figure 8C:
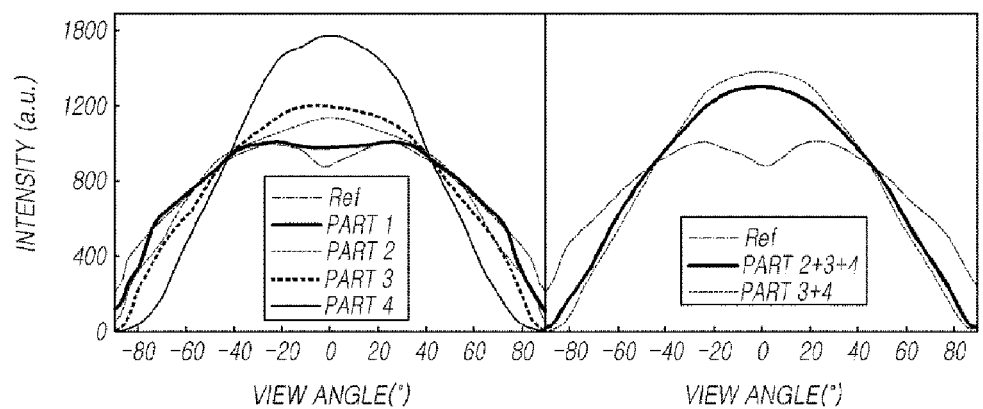

FIG. 8A through FIG. 8C are diagrams comparatively illustrating an external light extraction efficiency and a distribution (view angle) depending on a location of an emission surface of an organic emission layer (adjustment of an effective emission area) with an adjusted thickness of a pattern layer disposed on a concave portion of an overcoating layer.

Presuming that a height from the bottom of the concave portion 361 of the overcoating layer 360 to the top of the first connection portion 362 is "H", the organic emission layer 342 is divided into four equal parts from the bottom of the concave portion 361, as illustrated in FIG. 8A, and an external light extraction efficiency and a distribution (view angle) depending on a location of an emission surface of the organic emission layer 342 (adjustment of an effective emission area) are compared using a general simulation tool at each location between the bottom of the concave portion 361 and 1H/4 (Part1), between 1H/4 and 2H/4 (Part2), between 2H/4 and 3H/4 (Part3), and between 3H/4 and H (Part4). Meanwhile, a general organic light emitting display device in which a micro lens array structure is not applied to the overcoating layer 360 and the organic light emitting diode 340 is set as a reference Ref.

As illustrated in FIG. 8B and FIG. 8C, it can be seen that at each location between the bottom of the concave portion 361 and 1H/4 (Part1), between 1H/4 and 2H/4 (Part2), between 2H/4 and 3H/4 (Part3), and between 3H/4 and H (Part4) illustrated in FIG. 8A, a front-side light extraction efficiency of the organic emission layer 343 is greatly increased from Part 1 to Part 4 due to the micro lens array structure. Particularly, it can be seen that the front-side light extraction efficiency of Part 3 and Part 4 is improved by 30% to 40% as compared with that of the reference Ref.

Therefore, presuming that the height from the bottom of the concave portion 361 of the overcoating layer 360 to the top of the first connection portion 362 is "H", the top surface of the pattern layer 337 may be located between the bottom of the concave portion 361 and 2H/4. Because the top surface of the pattern layer 337 is located between the bottom of the concave portion 361 and 2H/4, the effective emission area A may be formed from the bottom of the concave portion 361 and 2H/4 to H. Thus, the front-side light extraction efficiency can be maximized.

Figure 9:
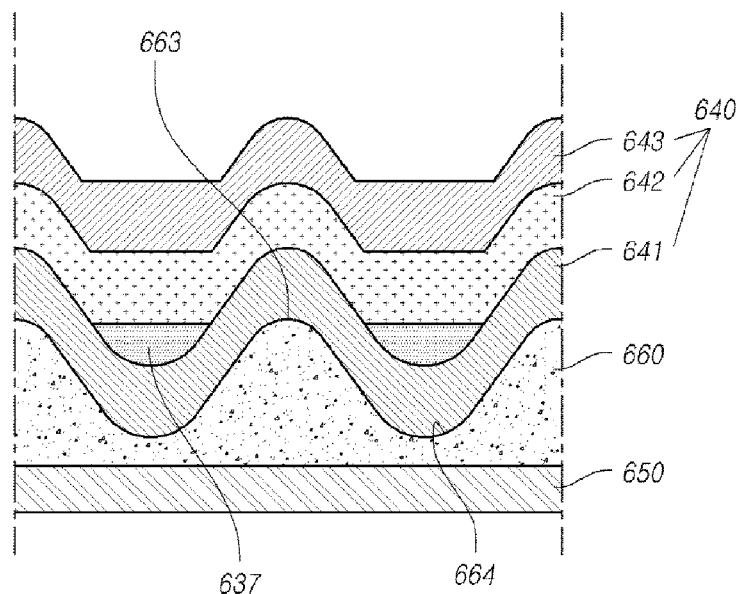
FIG. 9 is a cross-sectional view provided to explain an organic light emitting display device including an overcoating layer having a plurality of convex portions according to yet another example embodiment.

FIG. 9 is a cross-sectional view provided to explain an organic light emitting display device including an overcoating layer having a plurality of convex portions according to yet another example embodiment.

In FIG. 9, an organic light emitting display device 600 according to yet another example embodiment is substantially the same as the organic light emitting display device 300 illustrated in FIG. 4A and FIG. 4B except that an overcoating layer 660 includes a plurality of convex portions 663 and a pattern layer 637 is disposed on a second connection portion 664 between the plurality of convex portions 663, and, thus, the redundant description thereof will be omitted. Other elements of the organic light emitting display device 600 that are not illustrated in FIG. 9 may be identical to the elements of the organic light emitting display device 300 according to another example embodiment descried with reference to FIG. 3.

The overcoating layer 660 includes the plurality of convex portions 663 formed to overlap a color filter 650 and the second connection portion 664 that connects the convex portions 663 adjacent to each other. In other words, the overcoating layer 660 includes the plurality of convex portions 663 overlap the opening 336a of the bank layer 336 illustrated in FIG. 3 and a plurality of second connection portions 664 each connecting the convex portions 663.

A first electrode 641 is disposed on the overcoating layer 660. A pattern layer 637 is disposed on the overcoating layer 660 and the first electrode 641, and an organic emission layer 642 and a second electrode 643 are disposed on the first electrode 641 and the pattern layer 637. The first electrode 641, the organic emission layer 642, and the second electrode 643 constitute an organic light emitting diode 640. The pattern layer 637 may be located on all or some of the plurality of second connection portions 664.

Because the pattern layer 637 is located on all or some of the plurality of second connection portions 664, the pattern layer 637 is disposed between the first electrode 641 and the organic emission layer 642 and the second electrode 642 in a non-effective emission area in the same manner as the pattern layer 337 located on the concave portion 361 described with reference to FIG. 1 through FIG. 8 so that a light cannot be emitted. Thus, it is possible to minimize or suppress most of the light from being confined in the organic light emitting diode 640 without a contribution to improvement of light extraction efficiency in the non-effective emission area. Further, it is possible to minimize or suppress lights confined in the organic light emitting diode 640 from remaining as light leakage components in the non-effective emission area B. Accordingly, the external light extraction efficiency of the organic light emitting diode 640 can be maximized.

Figure 10:
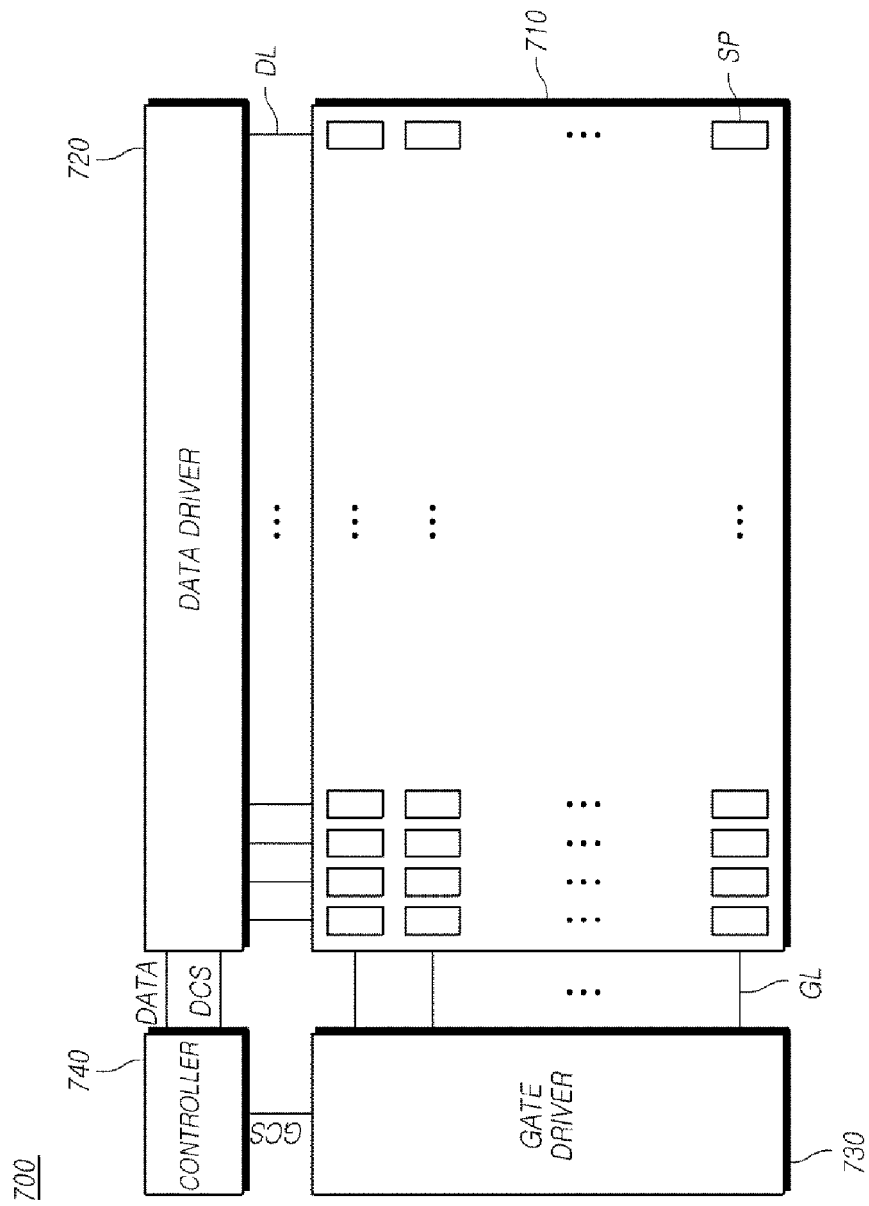
FIG. 10 is a schematic system configuration view of an organic light emitting display device according to the present example embodiments.

FIG. 10 is a schematic system configuration view of an organic light emitting display device according to the present example embodiments.

With reference to FIG. 10, an organic light emitting display device 700 according to the present example embodiments includes an organic light emitting display panel 710 in which a plurality of data lines DL and a plurality of gate lines GL are disposed and a plurality of subpixels SP is disposed in a matrix, a data driver 720 configured to drive the plurality of data lines by supplying a data voltage to the plurality of data lines, a gate driver 730 configured to sequentially drive the plurality of gate lines GL by sequentially supplying a scan signal to the plurality of gate lines, and a controller 740 configured to control the data driver 720 and the gate driver 730. Each of a plurality of pixels disposed in the organic light emitting display panel 710 according to the present example embodiments includes the thin-film transistor and the organic light emitting diode described above with reference to FIG. 1 thorough FIG. 9.

According to the above-described example embodiments, the organic light emitting display device can improve external luminous efficiency and also reduce power consumption.

Further, according to the above-described example embodiments, the organic light emitting display device can improve the shape uniformity of bends of the overcoating layer that improve external luminous efficiency and also maintain the reliability of the device.

It will be apparent to those skilled in the art that various modifications and variations can be made in the organic light emitting display device of the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   an overcoating layer on a substrate;
   a first electrode on the overcoating layer;
   a bank layer on the overcoating layer and the first electrode, the bank layer including an opening through which the first electrode is exposed;
   a pattern layer having an island shape on the exposed portion of the first electrode;
   an organic emission layer on the first electrode and the pattern layer; and
   a second electrode on the organic emission layer,
   wherein the pattern layer includes a same material as the bank layer.

2. The organic light emitting display device according to claim 1, wherein the first electrode is flat, and wherein the organic emission layer is continuously convex on the pattern layer.

3. An organic light emitting display device, comprising:
   an overcoating layer on a substrate;
   a first electrode on the overcoating layer;
   a bank layer on the overcoating layer and the first electrode, the bank layer including an opening through which the first electrode is exposed;
   a pattern layer having an island shape on the exposed portion of the first electrode;
   an organic emission layer on the first electrode and the pattern layer; and
   a second electrode on the organic emission layer,
   wherein the overcoating layer includes a plurality of concave portions overlaps the opening of the bank layer and a plurality of first connection portions each connecting the concave portions, and
   wherein the pattern layer is located on all or some of the plurality of concave portions.

4. The organic light emitting display device according to claim 3, wherein the first electrode is on the overcoating layer with a lower surface having a shape corresponding to the surface topology of the overcoating layer, and
   wherein the organic emission layer is continuously convex on the first electrode layer.

5. The organic light emitting display device according to claim 4, wherein the organic emission layer, over portions corresponding to a plurality of concave portions of the first electrode, is flat.

6. The organic light emitting display device according to claim 3, further comprising:
a color filter under the overcoating layer to overlap the opening of the bank layer,
wherein all or some of the plurality of concave portions of the overcoating layer define openings such that the first electrode contacts the color filter through the openings of the concave portions.

7. The organic light emitting display device according to claim 3, wherein a height from the bottom of the concave portion of the overcoating layer to the top of the first connection portion is H, and wherein the pattern layer is located between the bottom of the concave portion and 2H/4.

8. The organic light emitting display device according to claim 3, wherein a thickness of the organic emission layer between the concave portion and the first connection portion is less than a thickness of the organic emission layer at the bottom of the concave portion or the top of the first connection portion.

9. The organic light emitting display device according to claim 8, wherein the organic emission layer has the smallest thickness at a location where the organic emission layer has the highest slope between the concave portion and the first connection portion.

10. The organic light emitting display device according to claim 3, wherein an emission amount per unit area of the organic emission layer between the concave portion and the first connection portion is greater than an emission amount per unit area of the organic emission layer at the bottom of the concave portion or the top of the first connection portion.

11. An organic light emitting display device, comprising:
an overcoating layer on a substrate;
a first electrode on the overcoating layer;
a bank layer on the overcoating layer and the first electrode, the bank layer including an opening through which the first electrode is exposed;
a pattern layer having an island shape on the exposed portion of the first electrode;
an organic emission layer on the first electrode and the pattern layer; and
a second electrode on the organic emission layer,
wherein the overcoating layer includes a plurality of convex portions overlapping the opening of the bank layer and a plurality of second connection portions each connecting the convex portions, and
wherein the pattern layer is located on all or some of the plurality of second connection portions.

12. The organic light emitting display device according to claim 11, wherein an area corresponding to the pattern layer is a non-effective emission area.

13. The organic light emitting display device according to claim 11, further comprising a color filter under the overcoating layer to overlap the opening of the bank layer.

14. The organic light emitting display device according to claim 13, wherein the first electrode contacts the color filter through between the plurality of convex portions of the overcoating layer, and
wherein the pattern layer is located over contact portions of the first electrode and the color filter.

15. The organic light emitting display device according to claim 11, wherein the pattern layer includes a same material as the bank layer.

16. The organic light emitting display device according to claim 1, further comprising a color filter under the overcoating layer to overlap the opening of the bank layer.

17. The organic light emitting display device according to claim 3, wherein the pattern layer includes a same material as the bank layer.

18. The organic light emitting display device according to claim 3, further comprising a color filter under the overcoating layer to overlap the opening of the bank layer.

19. The organic light emitting display device according to claim 18, wherein the first electrode contacts the color filter through the plurality of concave portions of the overcoating layer, and
wherein the pattern layer is located over contact portions of the first electrode and the color filter.

20. The organic light emitting display device according to claim 19, wherein each of the organic emission layer and the second electrode includes a plurality of plat portions overlapping the pattern layer and a plurality of convex portions between the plurality of plat portions.

* * * * *